(12) United States Patent
Lim et al.

(10) Patent No.: US 9,455,259 B2
(45) Date of Patent: Sep. 27, 2016

(54) SEMICONDUCTOR DEVICES INCLUDING DIFFUSION BARRIERS WITH HIGH ELECTRONEGATIVITY METALS

(71) Applicant: Samsung Electronics Co., Ltd., Suwon-si, Gyeonggi-do (KR)

(72) Inventors: Han-Jin Lim, Seoul (KR); Youn-Soo Kim, Yongin-si (KR); Hyun Park, Suwon-si (KR); Soon-Gun Lee, Hwaseong-si (KR); Eun-Ae Cho, Seoul (KR); Chin-Moo Cho, Seoul (KR); Sung-Jin Kim, Suwon-si (KR); Seok-Woo Nam, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/716,371

(22) Filed: May 19, 2015

(65) Prior Publication Data

US 2016/0079247 A1    Mar. 17, 2016

(30) Foreign Application Priority Data

Sep. 16, 2014 (KR) .................. 10-2014-0122857

(51) Int. Cl.
*H01L 27/108* (2006.01)
*H01L 49/02* (2006.01)

(52) U.S. Cl.
CPC ........ *H01L 27/10814* (2013.01); *H01L 28/75* (2013.01)

(58) Field of Classification Search
CPC .................... H01L 27/108; H01L 49/02
USPC ............ 257/306, 296–298, 310, 311
See application file for complete search history.

(56) References Cited

U.S. PATENT DOCUMENTS

| | | | | |
|---|---|---|---|---|
| 4,423,087 A | * | 12/1983 | Howard et al. | 427/79 |
| 5,923,062 A | * | 7/1999 | Ohno | 257/298 |
| 6,730,951 B2 | * | 5/2004 | Nagano et al. | 257/296 |
| 8,420,552 B2 | | 4/2013 | Takebayashi et al. | |
| 8,508,020 B2 | | 8/2013 | Hirota et al. | |
| 8,551,851 B2 | | 10/2013 | Chen et al. | |
| 8,652,854 B2 | | 2/2014 | Takamatsu et al. | |
| 8,741,731 B2 | | 6/2014 | Takebayashi et al. | |
| 2008/0029801 A1 | | 2/2008 | Nakamura | |
| 2009/0273882 A1 | | 11/2009 | Park et al. | |
| 2009/0293247 A1 | * | 12/2009 | Chiang | 29/25.02 |
| 2011/0102968 A1 | | 5/2011 | Choi et al. | |
| 2012/0309163 A1 | | 12/2012 | Kiyomura et al. | |

FOREIGN PATENT DOCUMENTS

| | | |
|---|---|---|
| JP | 2011-049531 | 3/2011 |
| JP | 2012-248813 | 12/2012 |
| KR | 1020000041432 A | 7/2000 |

(Continued)

*Primary Examiner* — Sheng Zhu
(74) *Attorney, Agent, or Firm* — Myers Bigel & Sibley, P.A.

(57) ABSTRACT

A semiconductor device includes a capacitor with reduced oxygen defects at an interface between a dielectric layer and an electrode of the capacitor. The semiconductor device includes a lower metal layer; a dielectric layer on the lower metal layer and containing a first metal; a sacrificial layer on the dielectric layer and containing a second metal; and an upper metal layer on the sacrificial layer. An electronegativity of the second metal in the sacrificial layer is greater than an electronegativity of the first metal in the dielectric layer.

20 Claims, 17 Drawing Sheets

(56) References Cited

FOREIGN PATENT DOCUMENTS

| KR | 100818652 B1 | 3/2008 |
| KR | 1020090115036 A | 11/2009 |
| KR | 1020110008398 A | 1/2011 |
| WO | WO 2008/108128 A1 | 9/2008 |

* cited by examiner

SEMICONDUCTOR DEVICES INCLUDING DIFFUSION BARRIERS WITH HIGH ELECTRONEGATIVITY METALS

CROSS-REFERENCE TO RELATED APPLICATION

This application claims priority from Korean Patent Application No. 10-2014-0122857 filed on Sep. 16, 2014 in the Korean Intellectual Property Office, and all the benefits accruing therefrom under 35 U.S.C. 119, the disclosure of which is incorporated herein by reference in its entirety.

BACKGROUND

1. Field

The present inventive concept relates to a semiconductor device.

2. Description of the Related Art

In order to support the recent trends toward large-capacity and highly integrated semiconductor devices, the design rules and minimum feature sizes of semiconductor devices are continuously decreasing. Such trends are particularly applicable to semiconductor memory devices, such as dynamic random access memories (DRAMs). In order for a DRAM to operate properly, each cell may be required to have capacitance that exceeds a predetermined level. An increase in the capacitance may increase an amount of charge that can be stored in a capacitor, thereby improving the refresh characteristic of the device. Improved refresh characteristics of semiconductor memory devices may increase yields.

The reliability of a capacitor may be affected by the quality of the interface between each of the two electrodes of the capacitor and a dielectric layer therebetween. That is to say, electric properties, such as leakage current, of the capacitor may be affected by characteristics of the dielectric layer.

SUMMARY

Example embodiments of the present inventive concept provide a semiconductor including a capacitor having improved performance by reducing a concentration of oxygen defects at an interface of the capacitor.

According to example embodiments of the present inventive concept, there is provided a semiconductor device including a lower metal layer, a dielectric layer on the lower metal layer and containing a first metal, a sacrificial layer on the dielectric layer and containing a second metal, and an upper metal layer on the sacrificial layer. An electronegativity of the second metal is greater than an electronegativity of the first metal.

According to example embodiments of the present inventive concept, there is provided a semiconductor device including a transistor including first and second impurity regions, a bit line electrically connected to the first impurity region, a lower electrode and electrically connected to the second impurity region, a dielectric layer on the lower metal layer and containing a first metal, a sacrificial layer on the dielectric layer and containing a second metal, and an upper metal layer on the sacrificial layer. An electronegativity of the second metal is greater than an electronegativity of the first metal.

According to example embodiments of the present inventive concept, there is provided a semiconductor device including a lower metal layer, a dielectric layer on the lower metal layer and containing a first metal, a diffusion barrier on the dielectric layer and containing ruthenium (Ru) or molybdenum (Mo), and an upper metal layer on the sacrificial layer and containing a second metal. The diffusion barrier is configured to obstruct diffusion of oxygen atoms from the dielectric layer into the upper metal layer and to supply oxygen atoms to the upper metal layer.

BRIEF DESCRIPTION OF THE DRAWINGS

The above and other features and advantages of the present inventive concept will become more apparent by describing in detail example embodiments thereof with reference to the attached drawings in which.

DETAILED DESCRIPTION OF THE EMBODIMENTS

Figure 1:
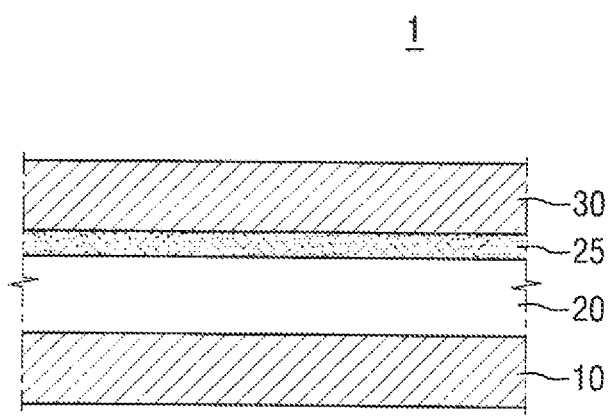
FIG. 1 is a cross-sectional view of a semiconductor device according to example embodiments of the present inventive concept.

The present inventive concept will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, a semiconductor device 1 according to example embodiments of the present inventive concept will be described with reference to FIGS. 1 to 6. FIG. 1 is a cross-sectional view of a semiconductor device 1 according to the example embodiments of the present inventive concept.

Referring to FIG. 1, the semiconductor device 1 may include a lower metal layer (or first conductor) 10, a dielectric layer 20, a sacrificial layer 25 and an upper metal layer (or second conductor) 30. The semiconductor device 1 may be a capacitor. The lower metal layer 10 may include at least one of doped polysilicon, a conductive metal nitride (e.g., titanium nitride, tantalum nitride, tungsten nitride, or the like), and/or a metal (e.g., a noble metal, such as ruthenium, iridium, or tantalum). The lower metal layer (or the first conductor) 10 may be a lower electrode of the capacitor, but aspects of the present disclosure are not limited thereto.

The dielectric layer 20 may be formed on the lower metal layer 10. The dielectric layer 20 may be, for example, a metal oxide dielectric layer and may include a high-k dielectric material. The high-k dielectric material may include, for example, one or more of zirconium oxide ($ZrO_2$), hafnium oxide ($HfO_2$), zirconium silicon oxide ($ZrSiO_x$), hafnium silicon oxide (HfSiOx), zirconium hafnium silicon oxide ($ZrHfSiO_x$), aluminum oxide ($Al_2O_3$), strontium titanium oxide ($SrTiO_3$), and/or barium strontium titanium oxide ($BaSrTiO_3$), but not limited thereto.

The sacrificial layer 25 may be formed on the dielectric layer 20. The sacrificial layer 25 may be an oxygen-containing compound, for example, a metal oxide. The sacrificial layer 25 may include, for example, at least one of hafnium oxide ($HfO_x$), titanium oxide ($TiO_x$), molybdenum oxide ($MoO_x$), niobium oxide ($NbO_x$), tantalum oxide ($TaO_x$), and/or ruthenium oxide ($RuO_x$). The sacrificial layer 25 may include a substance having higher electronegativity than a substance included in the dielectric layer 20. Electronegativity refers to the tendency of an atom to attract a bonding pair of electrons. As it is difficult for an element having a relatively high electronegativity value to be oxidized, elements having high electronegativity are easily reduced, i.e., easily engage in chemical reactions that involve the gaining of electrons.

Oxygen defects, such as oxygen vacancies, in the dielectric layer can deteriorate the interface characteristics of a capacitor. Oxygen vacancies can occur, for example, when oxygen in the dielectric layer reacts with metal in an electrode of the capacitor. However, because the sacrificial layer 25 has a material with higher electronegativity than the dielectric layer 20, the sacrificial layer 25, rather than the dielectric layer 20, may more readily provide oxygen atoms to the electrode.

In the metal oxide forming the sacrificial layer 25, the metal contained in the metal oxide may be a transition metal and may have many oxidation numbers. Therefore, the metal contained in the metal oxide forming the sacrificial layer 25 may be bonded to oxygen, thereby forming compounds having various chemical formulas. For example, when the sacrificial layer 25 is a titanium oxide, various oxides including TiO, $Ti_2O_3$, $Ti_3O_5$, $Ti_4O_7$, $TiO_2$ and so on may be formed.

The thickness of the sacrificial layer 25 may be less than that of the dielectric layer 20. In particular, the sacrificial layer 25 may have a thickness such that it does not serve as a dielectric layer. In some embodiments, for example, the sacrificial layer may have a thickness in a range of 5 Å to 10 Å.

The sacrificial layer 25 may be formed by, for example, atomic layer deposition (ALD) or chemical vapor deposition (CVD), but aspects of the present disclosure are not limited thereto.

In the semiconductor device 1 according to the example embodiments of the present inventive concept, the sacrificial layer 25 may be an electrically conductive layer. That is to say, the sacrificial layer 25 on the dielectric layer 20 may also serve as a part of an electrode of the device 1. The sacrificial layer 25 may include oxygen vacancies. Since the oxygen vacancies in the sacrificial layer 25 may form current paths through which electrical current can flow, the sacrificial layer 25 may be a part of the electrically conductive layer.

The sacrificial layer 25 may obstruct or prevent oxygen atoms contained in the dielectric layer 20 from diffusing into the upper metal layer 30, and may act as an oxygen supply layer that supplies oxygen atoms to the upper metal layer 30 during the manufacture of the semiconductor device. In addition, the sacrificial layer 25 may obstruct or prevent nitrogen atoms contained in the upper metal layer 30 from penetrating into the dielectric layer 20. The functions of the sacrificial layer 25 will be described in greater detail below.

The upper metal layer (or the second conductors) 30 may be formed on the sacrificial layer 25. In some embodiments, the upper metal layer 30 may be formed to directly contact the sacrificial layer 25. The upper metal layer 30 may include a conductive metal nitride. For example, the upper metal layer 30 may include at least one of titanium nitride (TiN), zirconium nitride (ZrN), aluminum nitride (AlN), hafnium nitride (HfN), tantalum nitride (TaN), niobium nitride (NbN), yttrium nitride (YN), lanthanum nitride (LaN), vanadium nitride (VN), tungsten nitride (WN) and/or manganese nitride ($Mn_4N$). The upper metal layer 30 may include a noble metal such as ruthenium (Ru), iridium (Ir) or platinum (Pt). The upper metal layer 30 may be an upper electrode of a capacitor.

Figure 2:
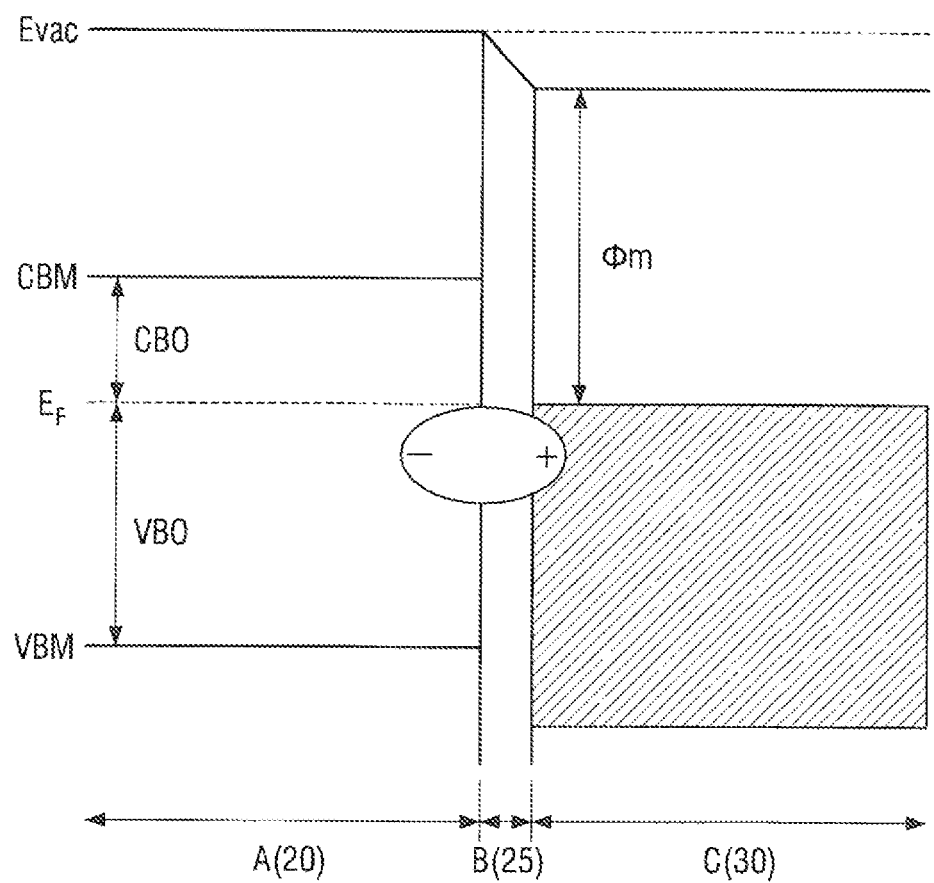
FIG. 2 is a diagram illustrating band offsets at interfaces of the semiconductor device shown in FIG. 1.
Figure 3:
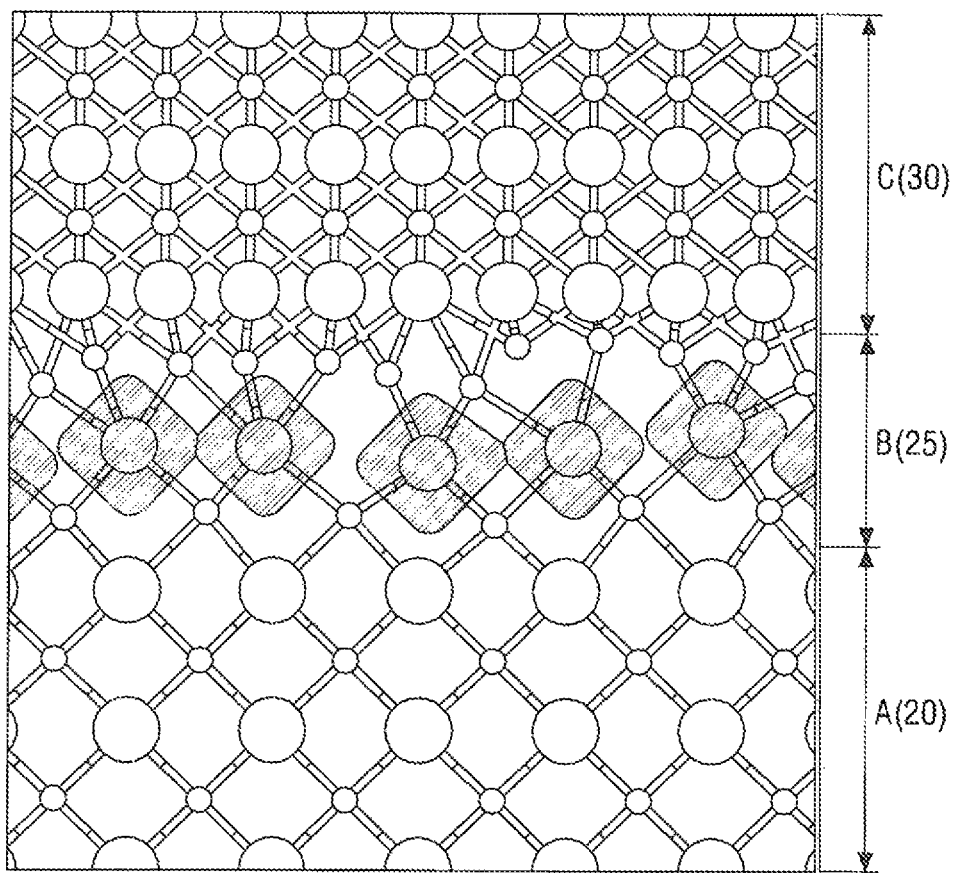
FIG. 3 is an image view for explaining a molecular structure of the semiconductor device shown in FIG. 1.
Figure 4:
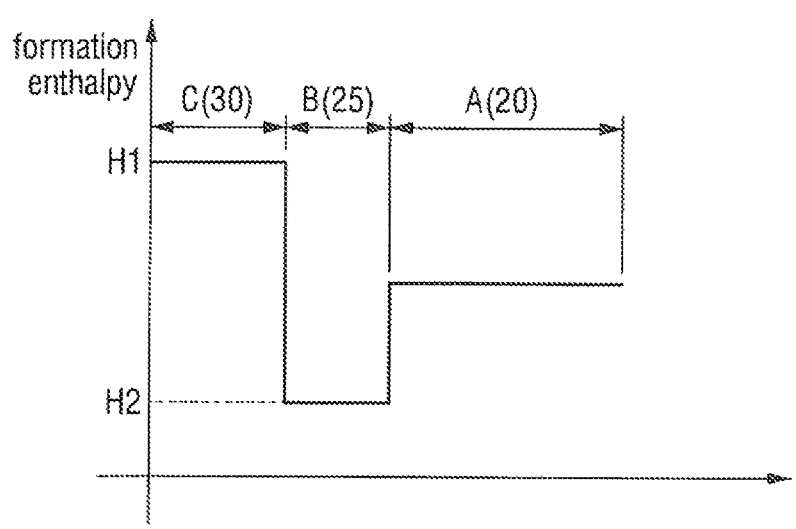
FIG. 4 is a diagram illustrating formation enthalpies of an the upper metal layer, and a the sacrificial supply layer and the dielectric layer of FIG. 1.
Figure 5:
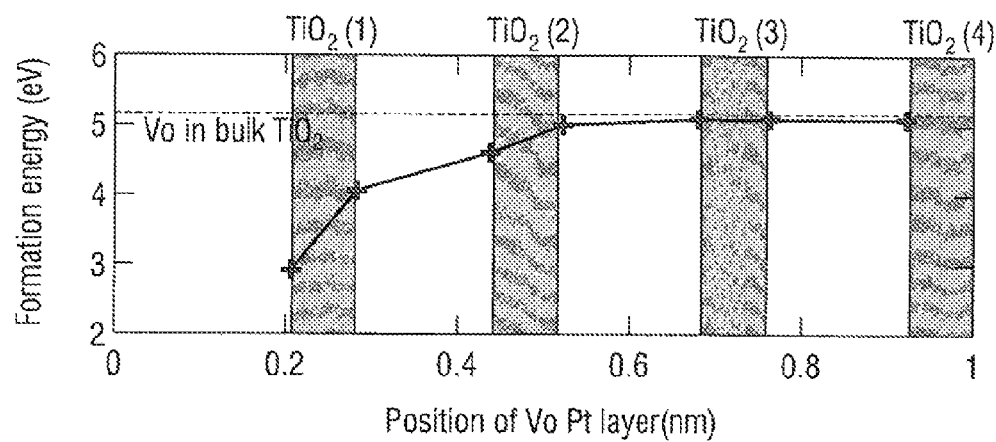
FIG. 5 is a graph illustrating formation energy of oxygen vacancies in a dielectric layer as a function of depending on a distance between from the sacrificial layer of FIG. 1.
Figure 6:
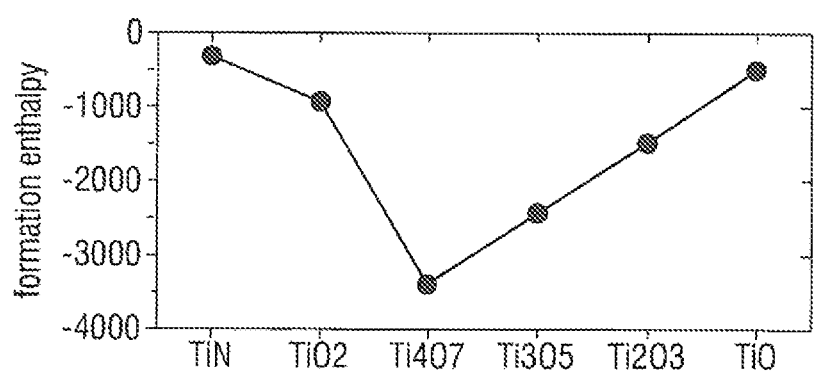
FIG. 6 is a graph illustrating formation enthalpies of various Ti based compounds.

FIG. 2 is a diagram that illustrates band offsets at various interfaces of the semiconductor device shown in FIG. 1. FIG. 3 is an image view that illustrates a molecular structure of the semiconductor device shown in FIG. 1. FIG. 4 is a diagram that illustrates relative formation enthalpies of the upper metal layer 30, the sacrificial layer 25 and the dielectric layer 20 of FIG. 1. FIG. 5 is a graph illustrating formation energy of oxygen vacancies in a dielectric layer 20 as a function of distance from the upper metal layer 30 of FIG. 1. In particular, FIG. 5 illustrates that oxygen vacancies can form more easily near the upper metal layer where the formation energy is lower. FIG. 6 is a graph illustrating formation enthalpies for various Ti based compounds.

Referring to FIGS. 1 to 6, in order to reduce an energy state of an interface where a metal material C, such as the upper metal layer 30, and a dielectric material A, such as the dielectric layer 20, make contact with each other, an oxygen vacancy in the dielectric layer 20 may move to the interface between the upper metal layer 30 and the dielectric layer 20. In addition, as illustrated in FIG. 5, the energy of forming an oxygen vacancy in the dielectric layer 20 is reduced near the interface between the dielectric layer 20 and the upper metal layer 30, thereby facilitating formation of the oxygen vacancy. Accordingly, the oxygen of the dielectric layer 20 may be taken away by the upper metal layer 30.

Referring to FIG. 1 and FIG. 5, the upper metal layer 30 may include, for example, a Pt layer and the dielectric layer 20 may include, for example, a $TiO_2$ layer. Referring to FIG. 1 and FIG. 5, as a position from the Pt layer used as the upper metal layer 30 is far away, the oxygen vacancy formation energy in the dielectric layer 20 may increase. Conversely, the oxygen vacancy formation energy at the interface between the upper metal layer 30 and the dielectric layer 20 may decrease. As described above, the low oxygen vacancy forming energy facilitates the formation of oxygen vacancies.

However, while not intending to be bound by a particular theory, when the sacrificial layer 25 is provided between the upper metal layer 30 and the dielectric layer 20, a valance band offset (VBO) near the interface may be reduced. As the VBO is reduced, a conduction band offset (CBO) may be increased. A sum of CBO and VBO (that is, a difference between the conduction band level and the valence band level, i.e., the bandgap), which is an intrinsic characteristic of a substance, is not changed.

As the CBO is increased, a potential barrier between the upper metal layer 30 and the dielectric layer 20 may be increased. If the potential barrier is increased, oxygen in the dielectric layer 20 may be obstructed or prevented from moving to the upper metal layer 30. Therefore, while not intending to be bound by a particular theory, the sacrificial layer 25 provided between the dielectric layer 20 and the upper metal layer 30 may obstruct or prevent oxygen from being taken away from the dielectric layer 20.

The larger the difference in the electronegativity between the substance of the upper metal layer 30 and the substance of the sacrificial layer 25, the more the potential barrier may be increased.

TABLE 1

| Sacrificial Layer | Electronegativity (Pauling scale) | Valance Band Offset (eV) |
|---|---|---|
| $RuO_2$ | 2.2 | 2.76 |
| $MoO_2$ or $MoO_3$ | 2.16 | 3.53 |
| $SiO_2$ | 1.90 | 4.01 |
| $Al2O_3$ | 1.61 | 4.10 |
| $TiO_2$ | 1.54 | 4.12 |
| $ZrO_2$ | 1.33 | 4.47 |
| $HfO_2$ | 1.30 | 4.50 |

Table 1 indicates electronegativity and VBO values of materials included in the sacrificial layer 25. However, the materials included in the sacrificial layer 25 are not limited to those listed in Table 1. The larger the difference in the electronegativity between the material included in the sacrificial layer 25 and the material included in the upper metal layer 30, the more the potential barrier is increased. Therefore, when the sacrificial layer 25 contains Ru or Mo, the potential barrier may be increased.

FIG. 3 illustrates an upper metal layer 30 containing TiN, a sacrificial layer 25 containing $MoO_2$ and a dielectric layer 20 containing $ZrO_2$. The dielectric layer 20, the sacrificial layer 25 and the upper metal layer 30 are positioned in regions A, B and C, respectively. Due to existence of the sacrificial layer 25, the interface between the upper metal layer 30 and the sacrificial layer 25 may be bonded with the oxygen of the sacrificial layer 25. That is to say, the sacrificial layer 25, instead of the dielectric layer 20, may provide oxygen atoms for bonding with the metal of the upper metal layer 30.

In a capacitor without the sacrificial layer 25, the dielectric layer 20 may be deprived of oxygen, unlike the above-described capacitor. In that case, trap assisted tunneling current may be increased by oxygen vacancies at interface between the dielectric layer 20 and the upper metal layer 30. Accordingly, a soft breakdown may occur due to a stress voltage of the capacitor, thereby deteriorating the reliability of a semiconductor device.

A semiconductor device 1 according to example embodiments of the present inventive concept can overcome the drawback, thereby improving the reliability of the capacitor and increasing capacitance.

FIG. 4 is a diagram of a formation enthalpy between an upper metal layer 30 (region C) and a sacrificial layer 25 (region B) of FIG. 1.

When formation enthalpy has a negative value, the energy state of a reaction starting material may be higher than the energy state of the reaction end product. Conversely formation enthalpy having a positive value may suggest that the energy state of a reaction starting material is lower than that of a reaction end product. From the view point of thermodynamics, a substance generally tends to move to a lower energy state. This tendency, however, may change according to ambient reaction conditions.

Referring to FIGS. 1 to 4, reference symbol A denotes a dielectric layer 20, reference symbol B denotes a sacrificial layer 25 and reference symbol C denotes an upper metal layer 30. The upper metal layer 30 may have a first formation enthalpy H1 and the sacrificial layer 25 may have a second formation enthalpy H2. The first formation enthalpy H1 is higher than the second formation enthalpy 112. That is to say, the formation enthalpy H1 of the upper metal layer 30 is higher than the formation enthalpy 112 of the sacrificial layer 25.

In FIG. 4, the formation enthalpy of the dielectric layer 20 is between the formation enthalpy H1 of the upper metal layer 30 and the formation enthalpy H2 of the sacrificial layer 25. However, this is provided only for the sake of convenient explanation, and aspects of the present disclosure are not limited thereto.

In semiconductor devices according to embodiments of the present inventive concept, the formation enthalpy H2 of the metal oxide forming the sacrificial layer 25 may be the lowest one of formation enthalpies of compounds that can be formed by binding metal elements of the metal oxide forming the sacrificial layer 25 with oxygen atoms.

A substance having low formation enthalpy may be in a more stable state than a substance having high formation enthalpy. That is to say, in order to convert the substance having low formation enthalpy into the substance having high formation enthalpy, a relatively large amount of energy may be required. In order to allow oxygen atoms to diffuse from the dielectric layer 20 and then move to the upper metal layer 30, the oxygen atoms should pass through the sacrificial layer 25. However, since the formation enthalpy H2 of the sacrificial layer 25 is lowest among formation enthalpies of compounds that can be formed by binding metal elements of the metal oxide forming the sacrificial layer 25 with the oxygen atoms, the oxygen atoms contained in the dielectric layer 20 are diffused into the sacrificial layer 25, so that an oxygen concentration of the sacrificial layer 25 may be increased. In such a case, the formation enthalpy of the sacrificial layer 25 may increase.

However, a substance may tend to be maintained at a lower energy state. Thus, even if the oxygen atoms diffuse from the dielectric layer 20, they may not pass through an interface between the sacrificial layer 25 and the dielectric layer 20. That is to say, while not intending to be bound by a particular theory, the sacrificial layer 25 may obstruct or prevent diffusion of oxygen atoms contained in the dielectric layer 20 into the upper metal layer 30.

Because the sacrificial layer 25 having low formation enthalpy is positioned between the upper metal layer 30 and the dielectric layer 20, the sacrificial layer 25 may function as a potential barrier, thereby reducing/preventing movement of the oxygen atoms contained in the dielectric layer 20 to the upper metal layer 30.

From the view point of formation enthalpy, the sacrificial layer 25 may include, for example, at least one of hafnium oxide ($HfO_x$), titanium oxide ($TiO_x$), molybdenum oxide ($MoO_x$), niobium oxide ($NbO_x$), tantalum oxide ($TaO_x$), and/or ruthenium oxide ($RuO_x$). In addition, the upper metal layer 30 may include a conductive metal nitride, and examples thereof may include at least one of titanium nitride (TiN), zirconium nitride (ZrN), aluminum nitride (AlN), hafnium nitride (HfN), tantalum nitride (TaN), niobium nitride (NbN), yttrium nitride (YN), lanthanum nitride (LaN), vanadium nitride (VN), tungsten nitride (WN) and/or manganese nitride ($Mn_4N$). The upper metal layer 30 may include a noble metal such as ruthenium (Ru), iridium (Ir) or platinum (Pt).

In more detail, in a case where TiN and $TiO_x$ are used as the upper metal layer 30 and the sacrificial layer 25, respectively, the formation enthalpy relationship between the upper metal layer 30 and the sacrificial layer 25 will be described with reference to FIG. 6. In the illustrated embodiment, TiN and $TiO_x$ used as the upper metal layer 30 and the sacrificial layer 25 are provided only by way example. In some embodiments, TiN and $MoO_x$, may also be used as the upper metal layer 30 and the sacrificial layer 25, respectively.

The upper metal layer 30 and the sacrificial layer 25 may include the same metal element, i.e., titanium. Here, the upper metal layer 30 is a metal nitride, and the sacrificial layer 25 is a metal oxide.

The formation enthalpy of the titanium nitride contained in the upper metal layer 30 is higher than that of titanium oxide (TiOx) contained in the sacrificial layer 25. In FIG. 6, since formation enthalpies of various kinds of titanium oxides are lower than the formation enthalpy of the titanium nitride, the sacrificial layer 25 containing titanium oxide may be in a more stable energy state than the upper metal layer 30 containing titanium nitride.

In order to allow the oxygen atoms contained in the dielectric layer 20 to diffuse into and move to the upper metal layer 30 containing titanium nitride, the oxygen atoms contained in the dielectric layer 20 would have to pass through the sacrificial layer 25 containing titanium oxide in a more stable energy state than titanium nitride. However, since the titanium oxide may function as a potential barrier against oxygen diffusion, the sacrificial layer 25 reduce or prevent diffusion of oxygen atoms from the dielectric layer 20 to the upper metal layer 30 containing the titanium nitride.

Next, a function performed by the sacrificial layer 25 may be to serve as an oxygen donating layer providing oxygen atoms to the upper metal layer 30, instead of the dielectric layer 20, during the manufacturing process of the semiconductor device. That is to say, the sacrificial layer 25 may be an oxygen sacrificial layer supplying oxygen element.

In the semiconductor device 1 according to the example embodiments of the present inventive concept, the formation enthalpy of the upper metal layer 30 may be higher than that of the oxide of the upper metal layer 30, which may be produced by oxidizing the upper metal layer 30. Referring to FIG. 6, when the titanium nitride to be contained in the upper metal layer 30 reacts with oxygen to turn into titanium oxide, the formation enthalpy may be lowered. That is to say, if titanium nitride is oxidized, titanium oxide (which has a more stable energy state than titanium nitride) is produced.

That is to say, if the upper metal layer 30 is formed on the dielectric layer 20, the upper metal layer 30 may take oxygen atoms contained in the dielectric layer 20 to have a stable energy state. However, if the oxygen atoms contained in the dielectric layer 20 are taken by the upper metal layer 30, the capacitance of the dielectric layer 20 may be lowered and the reliability of the dielectric layer 20 may also be reduced.

These disadvantages may be overcome or reduced by introducing the sacrificial layer 25 containing metal oxide. The sacrificial layer 25 may reduce or prevent diffusion of oxygen atoms contained in the dielectric layer 20 into the upper metal layer 30 while providing some of the oxygen atoms contained in the sacrificial layer 25 to the upper metal layer 30. In such a manner, the sacrificial layer 25 may improve electrical characteristics of a structure including the dielectric layer 20 and the upper metal layer 30.

In detail, when the upper metal layer 30 is made of a metal nitride and the metal element of the upper metal layer 30 is bonded with oxygen, forming an oxide, it may become stabilized in view of energy by accepting oxygen atoms supplied from the sacrificial layer 25. However, the oxygen atoms supplied from the sacrificial layer 25 to the upper metal layer 30 may not form a metal oxide layer with the metal element due to formation conditions of the upper metal layer 30, and may escape from the upper metal layer 30, but aspects of the present disclosure are not limited thereto.

During the manufacturing process of the semiconductor device, the sacrificial layer 25 is formed such that the number of oxygen atoms bonded for each metal atom is relatively low. In other words, during the manufacturing process of the semiconductor device, the sacrificial layer 25 may supply the remaining oxygen atoms to a neighboring layer, that is, the upper metal layer 30 or the dielectric layer 20. Since the dielectric layer 20 is to be formed according to the stoichiometry, the remaining oxygen atoms produced from the sacrificial layer 25 may be supplied to the upper metal layer 30.

In addition, before the upper metal layer 30 is formed, the sacrificial layer 25 may be formed to have a stoichiometric composition. Therefore, the sacrificial layer 25, formed after the upper metal layer 30 is formed, loses oxygen atoms and becomes a compound having a nonstoichiometric composition. That is to say, materials forming the sacrificial layer 25 are bonded to each other with a composition ratio not satisfying the stoichiometry, In other words, a concentration of oxygen contained in the sacrificial layer 25 after the upper metal layer 30 is formed may be smaller than a concentration of the oxygen contained in the sacrificial layer 25 formed before the upper metal layer 30 is formed. Referring to FIG. 6, for example, before the upper metal layer 30 is formed, the sacrificial layer 25 may be $TiO_2$ having a stoichiometric composition. However, the sacrificial layer 25 formed when the upper metal layer 30 loses some oxygen atoms may include $TiO_x$, where $0<x<2$, which does not have the stoichiometric composition. When oxygen concentrations of $TiO_2$ and $TiO_x$ are compared, the concentration of the oxygen contained in $TiO_2$ contained in the sacrificial layer 25 formed before the upper metal layer 30 is formed is greater than that of the oxygen contained in $TiO_x$ contained in the sacrificial layer 25 formed after the upper metal layer 30 is formed.

Next, reducing or preventing diffusion of nitrogen atoms contained in the upper metal layer 30 into the dielectric layer 20, which may be a function of the sacrificial layer 25, will be described. That is to say, the sacrificial layer 25 may serve as a nitrogen diffusion reduction/prevention layer.

As described above, the upper metal layer 30 may include a metal nitride. In a case where the upper metal layer 30 is disposed on the dielectric layer 20 without using the sacrificial layer 25, nitrogen atoms contained in the upper metal layer 30 may diffuse into the dielectric layer 20, so that oxynitride may be formed in the dielectric layer 20.

When an oxynitride layer is formed due to diffusion of nitrogen atoms into the dielectric layer 20, a crystallization temperature of the dielectric layer 20 may rise.

Therefore, during the manufacturing process of the semiconductor device, to crystallize the deposited dielectric layer 20, it may be necessary to anneal the dielectric layer 20 at a higher temperature that would otherwise be necessary in the absence of nitrogen atoms. If the dielectric layer 20 with the nitrogen atoms diffused therein is crystallized at a crystallization temperature of the dielectric layer 20 without nitrogen atoms, the dielectric layer 20 with the nitrogen atoms may not be properly crystallized, deteriorating crystallinity of the dielectric layer 20.

However, when a sacrificial layer 25 that is capable of reducing or preventing the penetration/diffusion of nitrogen into the dielectric layer 20 is inserted between the dielectric layer 20 and the upper metal layer 30, the dielectric layer 20 may be crystallized at a relatively low temperature. Accordingly, the crystallinity of the dielectric layer 20 can be improved.

Figure 7:
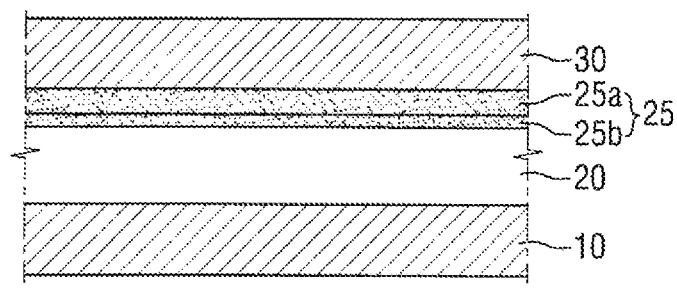
FIG. 7 is a cross-sectional view of a semiconductor device according to example embodiments of the present inventive concept.

FIG. 7 is a cross-sectional view of a semiconductor device 2 according to example embodiments of the present inventive concept.

The semiconductor device 2 according to the example embodiments of the present inventive concept of FIG. 7 is substantially the same as the semiconductor device 1 according to the example embodiment of the present inventive concept of FIGS. 1 to 6, except that a sacrificial layer includes a first sacrificial layer and a second sacrificial layer. Therefore, elements/layers that are the same as those of the example embodiments of the present inventive concept of FIGS. 1 to 6 are denoted by the same reference numerals, and repeated descriptions thereof will be briefly made or will be omitted.

Referring to FIG. 7, in the semiconductor device 2 according to the example embodiments of the present inventive concept, the sacrificial layer 25 includes a first sacrificial layer 25a and a second sacrificial layer 25b.

A dielectric layer 20, the second sacrificial layer 25b, the first sacrificial layer 25a and an upper metal layer 30 are sequentially formed on a lower metal layer 10.

The first sacrificial layer 25a may be an oxygen-containing compound, specifically a metal oxide. The first sacrificial layer 25a may include, for example, at least one of hafnium oxide ($HfO_x$), titanium oxide ($TiO_x$), molybdenum oxide ($MoO_x$), niobium oxide ($NbO_x$), tantalum oxide ($TaO_x$), and/or ruthenium oxide ($RuO_x$). In the metal oxide forming the first sacrificial layer 25a, the metal contained in the metal oxide may be a transition metal and may have many oxidation numbers. Therefore, the metal contained in the metal oxide forming the first sacrificial layer 25a may be bonded to oxygen, thereby forming compounds having various chemical formulas. For example, when the first sacrificial layer 25a is a titanium oxide, titanium as a metal element of the titanium oxide may have many oxidation numbers, thereby forming various oxides, including TiO, $Ti_2O_3$, $Ti_3O_5$, $Ti_4O_7$, $TiO_2$, and so on.

The first sacrificial layer 25a may have a thickness in which it does not serve as a dielectric layer, for example, in a range of between 5 Å and 10 Å. The thickness of the first sacrificial layer 25a may be less than that of the dielectric layer 20.

The first sacrificial layer 25a may be formed by, for example, atomic layer deposition (ALD) or chemical vapor deposition (CVD), but aspects of the present disclosure are not limited thereto.

In the semiconductor device 2 according to the example embodiments of the present inventive concept, the first sacrificial layer 25a may be an electrically conductive layer. That is to say, the first sacrificial layer 25a may also serve as part of the upper electrode. The first sacrificial layer 25a may include oxygen vacancies. Since the oxygen vacancies in the first sacrificial layer 25a are capable of forming a current path through which a current can flow, the first sacrificial layer 25a may be an electrically conductive layer.

The first sacrificial layer 25a may obstruct or prevent oxygen atoms contained in the dielectric layer 20 from diffusing into the upper metal layer 30 and may act as an oxygen supply layer that supplies oxygen atoms to the upper metal layer 30 during the manufacture of the semiconductor device. In addition, the first sacrificial layer 25a may obstruct or prevent nitrogen atoms contained in the upper metal layer 30 from penetrating into the dielectric layer 20.

The second sacrificial layer 25b is interposed between the dielectric layer 20 and the first sacrificial layer 25a. The second sacrificial layer 25b is formed to be in contact with the first sacrificial layer 25a. That is to say, the first sacrificial layer 25a may be in direct contact with the second sacrificial layer 25b and the upper metal layer 30 and may be interposed between the second sacrificial layer 25b and the upper metal layer 30. Along with the first sacrificial layer 25a, the second sacrificial layer 25b may prevent or reduce diffusion of oxygen atoms contained in the dielectric layer 20 into the upper metal layer 30. That is to say, the second sacrificial layer 25b may be another oxygen diffusion reducing/preventing layer, which can supplement the oxygen diffusion preventing/reducing function performed by the first sacrificial layer 25a.

The second sacrificial layer 25b may be an oxygen-containing compound, specifically aluminum oxide ($Al_2O_3$). Since aluminum contained in the second sacrificial layer 25b exists in the second sacrificial layer 25b in the form of an $Al^{3+}$ ion, it has relatively strong oxygen affinity. Therefore, the second sacrificial layer 25b may prevent or reduce diffusion of oxygen contained in the dielectric layer 20 into the upper metal layer 30 through the second sacrificial layer 25b.

The second sacrificial layer 25b may be formed by, for example, atomic layer deposition (ALD) or chemical vapor deposition (CVD), but aspects of the present disclosure are not limited thereto.

The overall dielectric constant of the second sacrificial layer 25b and the dielectric layer 20 may be reduced by the second sacrificial layer 25b. In order to prevent or reduce lowering of a dielectric constant of the second sacrificial layer 25b and the dielectric layer 20, it may be desirable to reduce the effect of the second sacrificial layer 25b. To this end, the second sacrificial layer 25b may have a thickness in a range of, for example, 1 Å to 5 Å. In addition, the thickness of the second sacrificial layer 25b may be less than that of the first sacrificial layer 25a.

In the semiconductor device 2 according to the example embodiments of the present inventive concept, an oxygen diffusion preventing/reducing layer (to prevent or reduce oxygen diffusion in the dielectric layer 20) may have a double layered structure including the first sacrificial layer 25a and the second sacrificial layer 25b.

Although the oxygen diffusion preventing/reducing layer on the dielectric layer 20 has a double layered structure, the first sacrificial layer 25a of the oxygen diffusion preventing/reducing layer may be a conductive layer and the second sacrificial layer 25b may be an insulating dielectric layer.

The use of semiconductor devices 1 and 2 according to the example embodiments of the present inventive concept for information storage units of memory devices will now be described with reference to FIGS. 8 to 10. In the following description, the information storage units are capacitors, but aspects of the present disclosure are not limited thereto.

A layout view illustrating semiconductor devices according to example embodiments of the present inventive concept will be described with reference to FIG. 8.

Figure 8:
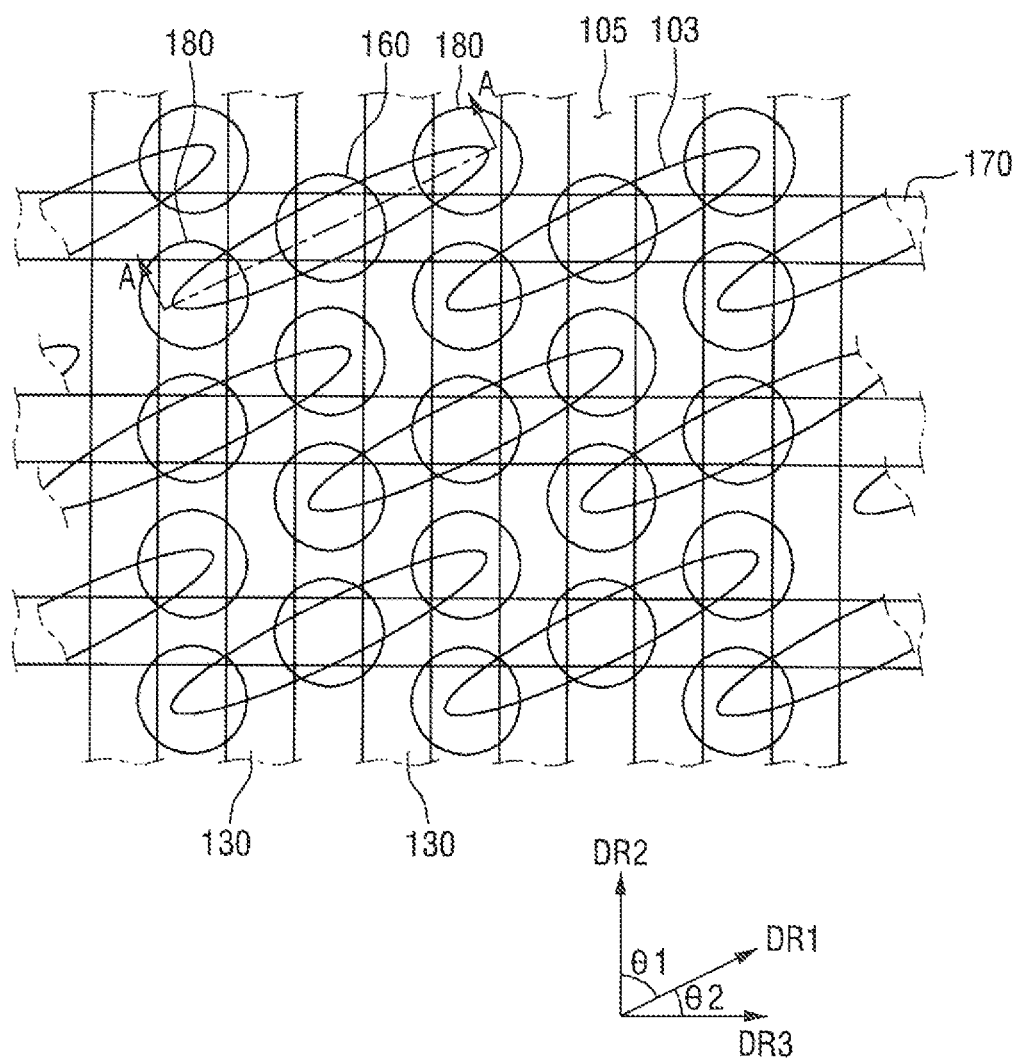
FIG. 8 is a layout view of semiconductor devices according to example embodiments of the present inventive concept.

FIG. 8 is a layout view of semiconductor devices according to the example embodiments of the present inventive concept.

That is to say, FIG. 8 is a layout view illustrating semiconductor devices prior to formation of the information storage units.

Referring to FIG. 8, in the semiconductor devices according to the present inventive concept, a unit active region(s) 103 is defined by forming an isolation region(s) 105 in a substrate 100.

In greater detail, each unit active region 103 extends in a first direction DR1, each gate electrode (that is, word line) 130 extends in a second direction DR2 (which forms an acute angle with respect to the first direction DR1), and each bit line 170 extends in a third direction D3, which forms an acute angle with respect to the first direction DR1.

Here, the term "angle" used in the phrase "a predetermined angle formed between a particular direction and another particular direction" may mean a smaller angle of two angles formed when two directions cross each other, for example, 60° in a case where angles formed by two crossing directions are 120° and 60°. Therefore, as shown in FIG. 8, an angle formed by the first direction DR1 and the second direction DR2 is θ1, and an angle formed by the first direction DR1 and the third direction DR3 is θ2.

Figure 9:
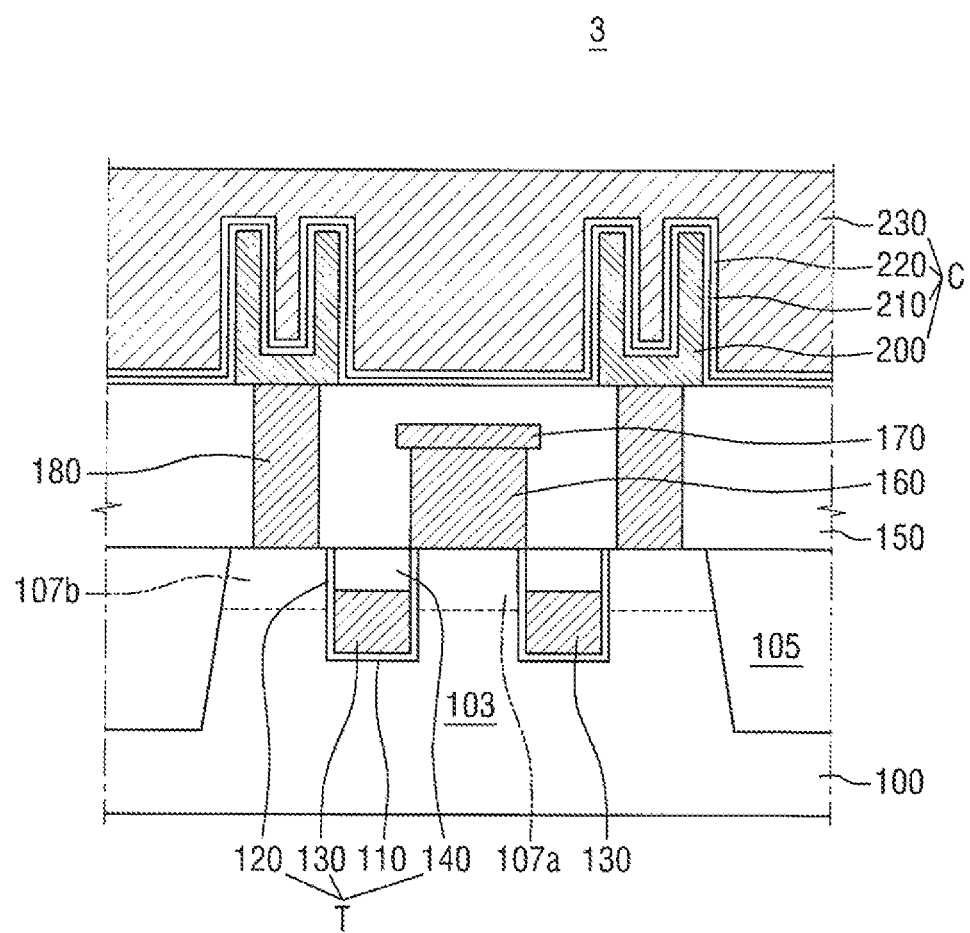
FIG. 9 illustrates the semiconductor device according to example embodiments of the present inventive concept.

As described above, θ1 and/or θ2 are established as acute angles for the purpose of providing an increased or maximum distance between a bit line contact 160 connecting the unit active region 103 and the bit line 170, and a storage node contact 180 (i.e., a second contact plug 180 of FIG. 9) connecting the unit active region 103 and the capacitor (C of FIG. 9). For example, θ1 and θ2 may be 45° and 45°, 30° and 60°, or 60° and 30°, respectively, but aspects of the present disclosure are not limited thereto.

FIG. 9 illustrates a semiconductor device 3 according to example embodiments of the present inventive concept. Specifically, FIG. 9 is a cross-sectional view taken along the line AA of FIG. 8, illustrating an example of a semiconductor device including a capacitor.

Referring to FIG. 9, the semiconductor device 3 may include a substrate 100, a transistor T, a bit line 170 and a capacitor C.

A unit active region 103 and an isolation region 105 may be formed on the substrate 100. The substrate 100 may be a bulk silicon substrate or a silicon-on-insulator (SOI) substrate. Alternatively, the substrate 100 may be a a substrate made of another material such as germanium, indium antimonide, lead telluride, indium arsenide, indium phosphide, gallium arsenide, or gallium antimonide, but not limited thereto. In the following description, the silicon substrate is exemplified. The isolation region 105 may be formed by a shallow trench isolation (STI) process. In FIG. 8, the unit active region 103 extending in the first direction DR1 may be defined by the isolation region 105.

Two transistors T may be formed in one unit active region 103. The two transistors T may include two gate electrodes 130 formed to cross the unit active region 103, a first impurity region 107a formed in the unit active region 103 between the two gate electrodes 130, and second impurity regions 107b formed in the active region 103 between each of the gate electrodes 130 and the respective isolation region 105. That is to say, the two transistors T may share the first impurity region 107a while not sharing the respective second impurity regions 107b.

Each of the two transistors T may include a gate insulation layer 120, a gate electrode 130 and a capping pattern 140.

The gate insulation layer 120 may be formed on side surfaces and a bottom surface of a trench 110 formed in the substrate 100. The gate insulation layer 120 may include, for example, silicon oxide and/or a high-k dielectric having a higher dielectric constant than silicon oxide. In FIG. 9, the gate insulation layer 120 may be formed on the entirety of the side surfaces of the trench 110, but aspects of present disclosure are not limited thereto. That is to say, the gate insulation layer 120 may be formed to be in contact with lower portions of the side surfaces of the trench 110, and a capping pattern 140 (to be described later) may be formed to be in contact with upper portions of the side surfaces of the trench 110.

The gate electrode 130 may be formed to fill a portion of the trench 110. That is to say, the gate electrode 130 may be recessed. The gate electrode 130 may be formed of, for example, doped polysilicon, titanium nitride (TiN), tantalum nitride (TaN), tungsten nitride (WN), titanium (Ti), tantalum (Ta), and/or tungsten (W), but the gate electrode 130 is not limited thereto. The capping pattern 140 may be formed on the gate electrode 130 to fill the trench 110. The capping pattern 140 may be formed of or including an insulating material, for example, at least one of silicon oxide, silicon nitride, and/or silicon oxynitride. In FIG. 9, the gate insulation layer 120 may fill a portion of trench 110 between portions of the capping pattern 140 and the substrate 100 (e.g., first and second impurity regions 107a, 107b), but aspects of present disclosure are not limited thereto. In some embodiments, the capping pattern 140 may be formed in contact with the substrate 100, for example, the first impurity region 107a and the second impurity region 107b.

In the semiconductor device 3 according to the example embodiments of the present inventive concept, the transistor T may be a buried channel array transistor (BCAT), but aspects of the present disclosure are not limited thereto. In some embodiments, the transistor T may have various structures including a planar transistor, and a vertical channel array transistor (VCAT) formed on the unit active region 103 shaped of a pillar, but aspects of the present disclosure are not limited thereto.

An interlayer insulation layer 150 may be formed on the substrate 100. The interlayer insulation layer 150 may include, for example, at least one of silicon oxide, silicon nitride, and/or silicon oxynitride. The interlayer insulation layer 150 may be formed of a single layer or multiple layers.

A first contact plug (bit line contact) 160 may be formed in the interlayer insulation layer 150. The first contact plug 160 may be electrically connected to the first impurity region 107a. The first contact plug 160 may be formed of or include a conductive material, for example, at least one of polysilicon, a metal silicide compound, and/or a metal, but aspects of the present disclosure are not limited thereto. A bit line 170 may be formed on the first contact plug 160. The bit line 170 may be electrically connected through first contact plug 160 to the first impurity region 107a. The bit line 170 may be formed of or include a conductive material for example, at least one of polysilicon, a metal silicide compound, a conductive metal nitride, and/or a metal, but aspects of the present disclosure are not limited thereto.

A second contact plug (storage node contact) 180 may be formed through the interlayer insulation layer 150. The second contact plug 180 may be electrically connected to a second impurity region 107b. The second contact plug 180 may be formed of or include a conductive material, for example, at least one of polysilicon, a metal silicide compound, a conductive metal nitride, and/or a metal, but aspects of the present disclosure are not limited thereto.

A capacitor C may be formed on the interlayer insulation layer 150. The capacitor C may be electrically connected to the second impurity region 107b through the second contact plug 180.

The capacitor C may include a lower electrode 200, a capacitor dielectric layer 210, a capacitor interface layer 220, and an upper electrode 230. Referring to FIGS. 1 and 7, the lower electrode 200 may be the lower metal layer, the capacitor dielectric layer 210 may be the dielectric layer 20, and the upper electrode 230 may be the upper metal layer 30. In addition, the capacitor interface layer 220 may be formed as the sacrificial layer 25 as shown in FIG. 1, or as a double layer including the first sacrificial layer 25a and the second sacrificial layer 25b as shown in FIG. 7.

The lower electrode 200 may be formed to protrude from the interlayer insulation layer 150 and may be electrically connected to the second contact plug 180. The lower electrode 200 may extend in a direction, for example, in a vertical direction with respect to a top surface of the substrate 100.

In the semiconductor device 3 according to the example embodiments of the present inventive concept, the lower electrode 200 may have a cylindrical shape with inner and outer sidewalls. The cylindrical shape shown in FIG. 9 is provided only for illustration, but aspects of the present disclosure are not limited thereto. Rather, the lower electrode 200 may have various shapes.

The capacitor dielectric layer 210 may be formed on the lower electrode 200. The capacitor dielectric layer 210 may be formed along the inner and outer sidewalls of the cylindrical lower electrode 200.

The capacitor interface layer 220 may be formed on the capacitor dielectric layer 210. As described above with reference to FIGS. 1 and 7, the capacitor interface layer 220 may be the sacrificial layer 25 that is made of a metal oxide and have second formation enthalpy H2. If the capacitor interface layer 220 has a double layered structure including the first sacrificial layer 25a and the second sacrificial layer 25b, as shown in FIG. 7, it may further include an $Al_2O_3$ layer formed on the capacitor dielectric layer 210.

The upper electrode 230 is formed on the capacitor interface layer 220 to be in contact with the capacitor interface layer 220. The upper electrode 230 may include, for example, a metal nitride and/or a noble metal. The metal nitride included in the upper electrode 230 has formation enthalpy H1 higher than formation enthalpy I12 of the metal oxide forming the capacitor interface layer 220.

In FIG. 9, the upper electrode 230 is formed on the interlayer dielectric layer 150 to have a plate shape, but aspects of the present disclosure are not limited thereto. The upper electrode 230 may be formed along the inner and outer sidewalls of the cylindrical lower electrode 200.

Figure 10:
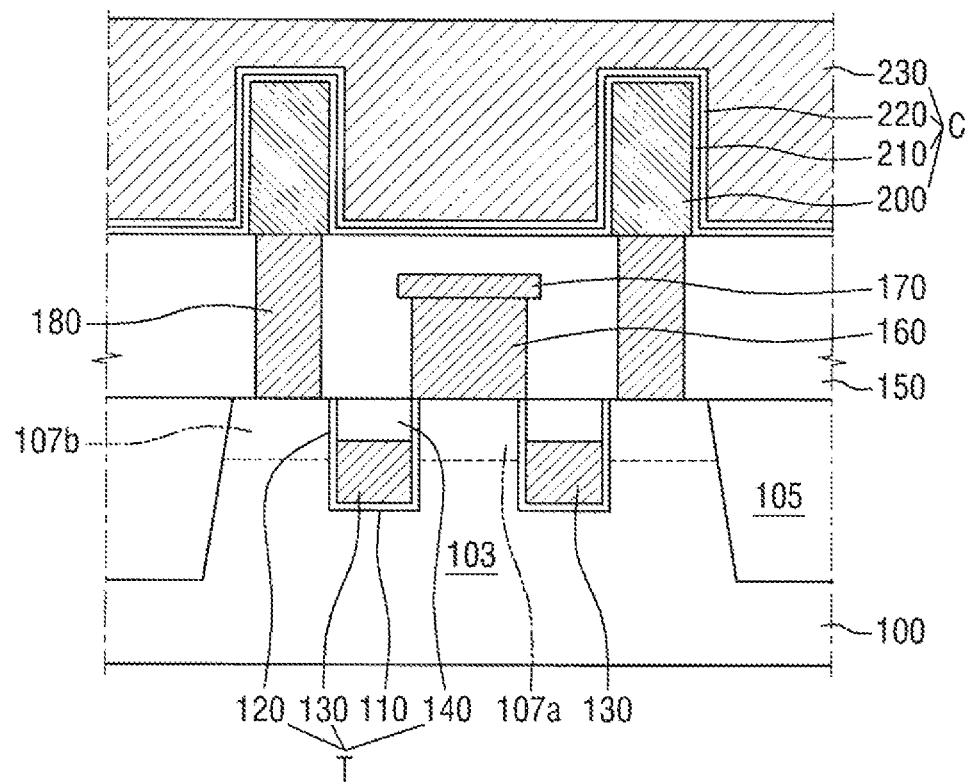
FIG. 10 illustrates the semiconductor device according to example embodiment of the present inventive concept.

FIG. 10 illustrates a semiconductor device 4 according to example embodiments of the present inventive concept. Specifically, FIG. 10 is a cross-sectional view taken along the line AA of FIG. 8, illustrating an example of semiconductor device including a capacitor.

Since this embodiment is substantially the same as the example embodiments of FIG. 9, except for the shape of a lower electrode, elements/layers that are substantially the same as those of the previous embodiments of FIG. 9 are denoted by the same reference numerals, and repeated descriptions thereof may be briefly made or omitted.

Referring to FIG. 10, the semiconductor device 4 according to the example embodiments may include a substrate 100, a transistor T, a bit line 170, and a capacitor C.

A lower electrode 200 is formed to protrude from an interlayer insulation layer 150 and is electrically connected to a second contact plug 180. The lower electrode 200 may extend in a direction, for example, in a vertical direction with respect to a top surface of the substrate 100.

In the semiconductor device 4 according to the example embodiment of the present inventive concept, the lower electrode 200 may be shaped of a pillar. The pillar shape shown in FIG. 10 is provided only for illustration, but aspects of the present disclosure are not limited thereto. That is to say, the lower electrode 200 may have various shapes.

The capacitor dielectric layer 210 and the capacitor interface layer 220 are formed along the outer sidewalls of the lower electrode 200.

Figure 11:
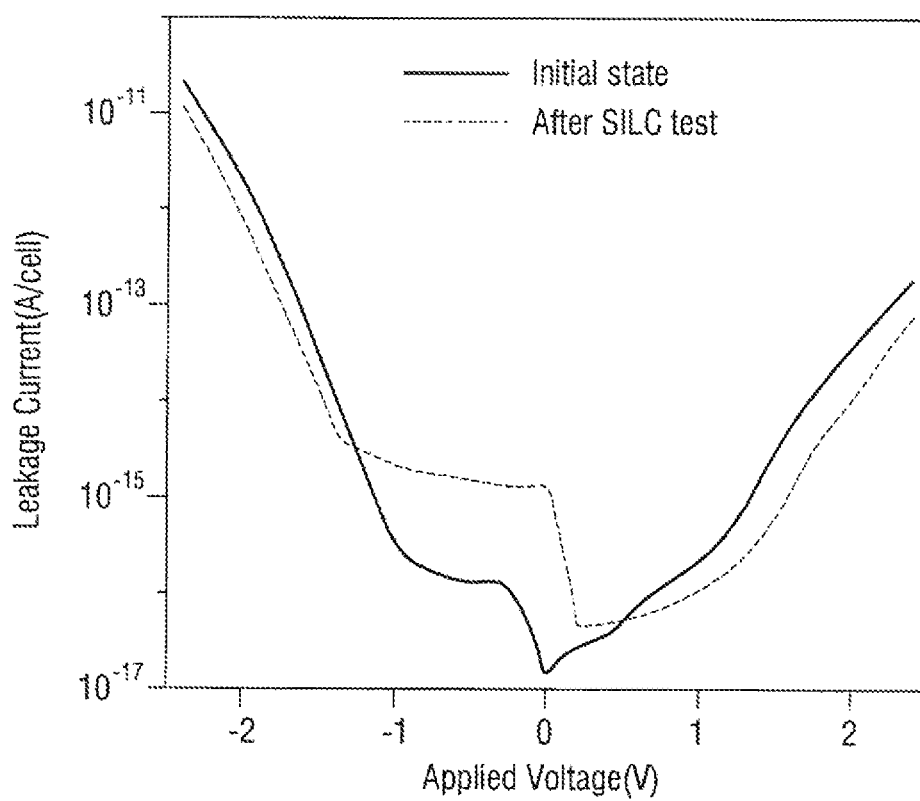
FIG. 11 is a graph illustrating leakage current increasing characteristics depending on the bias voltage applied to a capacitor in a general semiconductor device.

FIG. 11 is a graph illustrating leakage current increasing characteristics depending on the bias voltage applied to a capacitor in a general semiconductor device. Specifically, FIG. 11 is a graph illustrating current-voltage characteristics of a capacitor including a TiN upper electrode and a $ZrO_2$ dielectric layer.

Referring to FIG. 11, an initial-state current characteristic of the capacitor is compared with a soft breakdown current characteristic demonstrated after a bias voltage is applied to the capacitor many times for a stress induced leakage current (SILC) test. In FIG. 11, the solid line indicates the current characteristic of an initial state and the dotted line indicates the soft breakdown current characteristic.

In a case of the initial-state current characteristic, it is confirmed that a nearly linear current characteristic is demonstrated even in a negative voltage region. By contrast, in a case of the current characteristic demonstrated after a bias voltage is applied many times, it is confirmed that leakage current is increased in a negative voltage region due to soft breakdown. That is to say, as a voltage stress is induced, a Zr—O bond of a dielectric layer is broken at an interface between an upper electrode and the dielectric layer, forming a hole charge trap, thereby increasing leakage current.

Figure 12:
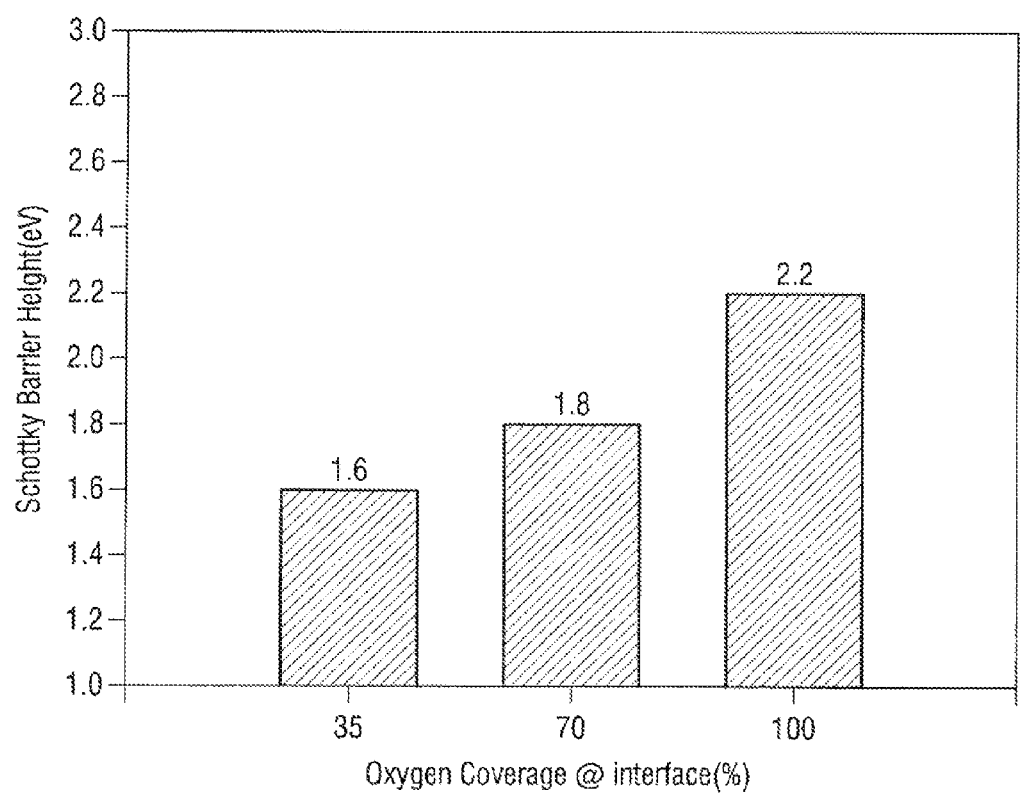
FIG. 12 illustrates a Schottky barrier height (SBH) depending on the oxygen bond of a dielectric layer in the semiconductor devices according to example embodiments of the present inventive concept of FIGS. 9 and 10.
Figure 13:
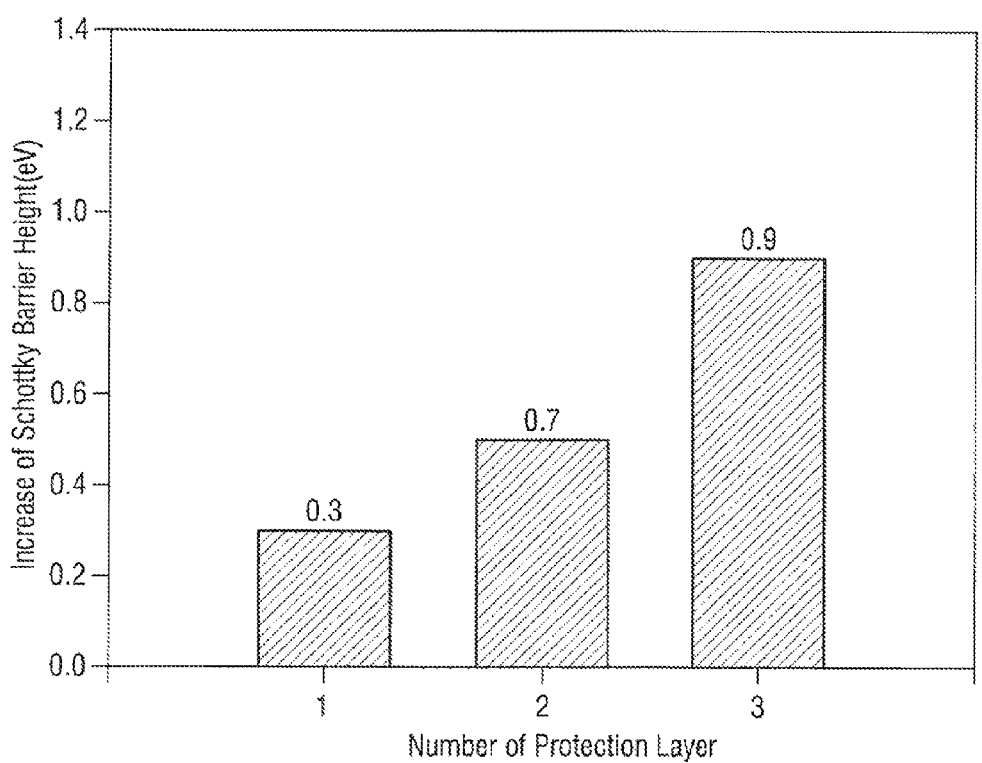
FIG. 13 illustrates a Schottky barrier height (SBH) depending on the thickness of a sacrificial dielectric layer in the semiconductor devices according to example embodiments of the present inventive concept of FIGS. 9 and 10.

FIG. 12 illustrates a Schottky barrier height (SBH) depending on the oxygen bond in a dielectric layer in the semiconductor devices 1 to 4 according to the example embodiments of the present inventive concept and FIG. 13 illustrates a Schottky barrier height (SBH) depending on the thickness of a sacrificial layer (capacitor interface layer) in the semiconductor devices 1 to 4 according to the example embodiments of the present inventive concept.

FIGS. 12 and 13 are graphs illustrating SBH values simulated by additionally providing a $TiO_x$ sacrificial layer between a TiN upper electrode and a $ZrO_2$ dielectric layer.

Referring to FIG. 12, it is confirmed that as the number of Zr—O bonds is increased, the SBH at the interface between the upper electrode and the dielectric layer is increased. In a case where Zr is completely boned with oxygen, the SBH may further increase up to 0.6 eV.

Meanwhile, if electronegativity of a substance contained in the sacrificial layer is relatively high, the SBH may increase more.

TABLE 2

| Sacrificial Layer Material (5 Å) | Schottky Barrier Height (eV) |
|---|---|
| $TiO_x$ | 0.6 eV |
| $MoO_x$ | 1.3 eV |

As confirmed from Table 2, the SBH of molybdenum having relatively high electronegativity is 1.3 eV higher than that of titanium. That is to say, in the Pauling scale, titanium has electronegativity of 1.54 and molybdenum has electronegativity of 2.16. In addition, since Ru has a Pauling' electronegativity scale of 2.2, the SBH of Ru may be increased more, thereby more efficiently performing an oxygen diffusion preventing function.

Referring to FIG. 13, the SBH is increased according to the thickness of the sacrificial layer. The thickness of the sacrificial layer may vary according to the number of atomic layers of the sacrificial layer. In a case where the number of atomic layers is in a range of 1 to 3, measuring results of increases in the SBH are shown in FIG. 13. As shown in FIG. 13, since a $TiO_x$ mono layer has a thickness in a range of about 2 Å to about 3 Å, the sacrificial layer having three layers may have a thickness in a range of about 6 Å to about 9 Å. However, the thickness range may vary according to the material of the sacrificial layer, but aspects of the present disclosure are not limited thereto.

Figure 14:
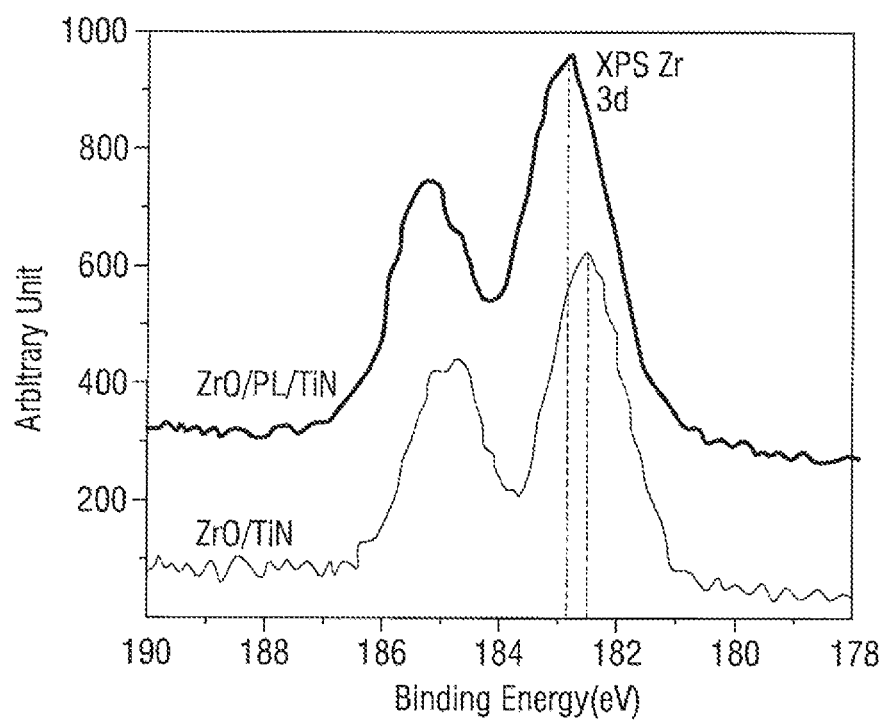
FIG. 14 is a diagram illustrating X-ray photoelectron spectroscopy (XPS) signals of the semiconductor devices according to example embodiments of the present inventive concept of FIGS. 9 and 10.

FIG. 14 is a diagram illustrating X-ray photoelectron spectroscopy (XPS) signals of the semiconductor devices 1 to 4 according to the example embodiments of the present inventive concept.

In detail, FIG. 14 illustrates an X-ray photoelectron spectroscopy (XPS) image obtained by actually adding a $TiO_2$ sacrificial layer between a TiN upper electrode and a $ZrO_2$ dielectric layer.

The X-ray photoelectron spectroscopy (XPS) uses X-ray as a light source and is also referred to as an electron spectroscopy for chemical analysis (ESCA). If the X-ray is incident and absorbed into a material, the X-ray energy excites electrons from a core level to a valence level to be ionized. In a case of a solid sample, some of the excited electrons escape into the vacuum to become photoelectrons. In the X-ray photoelectron spectroscopy (XPS), the kinetic energy is investigated. An X-ray based ionization cross-section for a valence electron is relatively small and many photoelectrons are emitted from a core orbital.

The X-ray photoelectron spectroscopy (XPS) allows elemental analysis using the energy of photoelectrons. In addition, since a core electron level of a material is changed by a chemical bond state of atoms and a change in the photoelectron energy is caused by the rearrangement of electrons and atoms with emission of the photoelectrons, thereby resulting in a chemical shift in the photoelectron spectrum.

Therefore, the chemical bond state of a sample can be analyzed through spectral analysis. Here, the analysis area is in a range of 1 to 3 mmΦ, the maximum analysis depth is 1 mm, and the sensitivity of element analysis is about 0.1%. X-rays for Mg or Al may be widely used as the X-ray light source. In addition, a synchrotron orbital radiation (SOR) may also be used as the X-ray light source.

In FIG. 14, the lower one of two graphs indicates the XPS signal (ZrO/TiN) before the sacrificial layer is additionally provided between the $ZrO_2$ dielectric layer and the TiN upper electrode and the upper one indicates the XPS signal (ZrO/PL/TIN) after the sacrificial layer is additionally provided between the ZrO₂ dielectric layer and the TiN upper electrode.

As confirmed from 3d peak values of Zr, the binding energy of the XPS signal (ZrO/PL/TIN) after the sacrificial layer is additionally provided is shifted by 5 eV from that of the XPS signal (ZrO/TIN) before the sacrificial layer is additionally provided. This suggests that the sacrificial layer prevents an occurrence of a bond having lower electronegativity than oxygen. Accordingly, the Zr—O bonds at the interface of the dielectric layer can be more firmly maintained.

Figure 15:
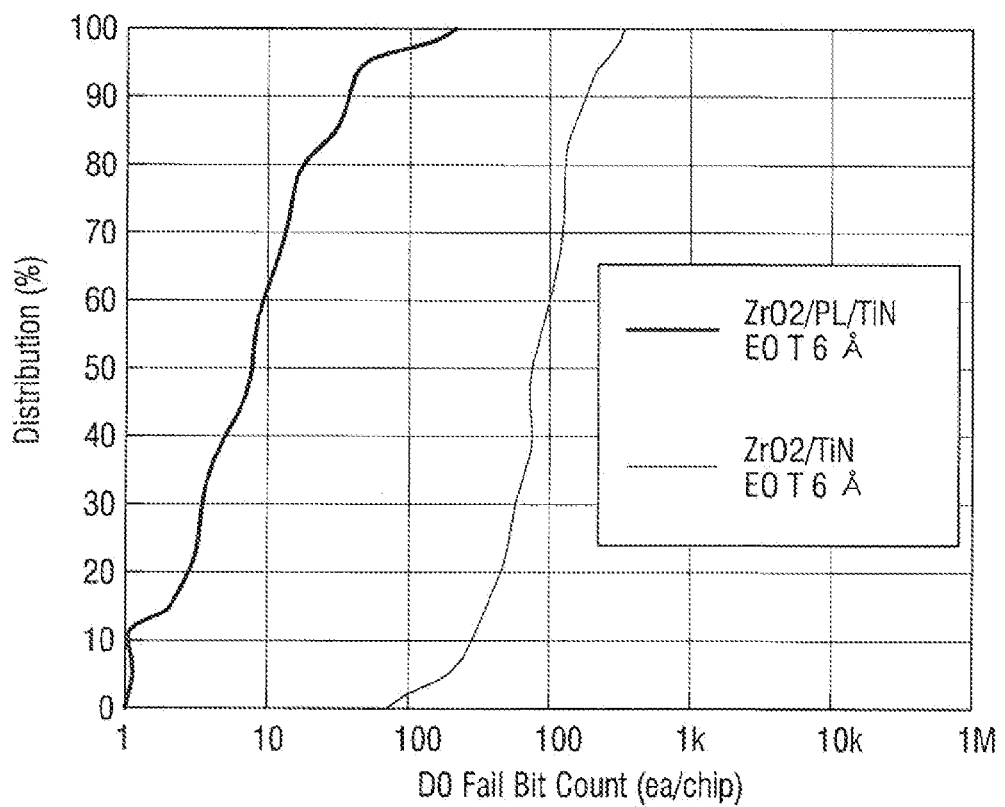
FIG. 15 is a graph illustrating a D0 fail bit distribution of the semiconductor devices according to example embodiments of the present inventive concept of FIGS. 9 and 10.

FIG. 15 is a graph illustrating a D0 fail bit distribution of the semiconductor devices 1 to 4 according to the example embodiments of the present inventive concept.

FIG. 15 is a graph illustrating actual measuring results of fail bits after data D0 is stored in a capacitor of a semiconductor device. In FIG. 15, the left graph indicates a D0 fail bit distribution (ZrO₂/PL/TIN) after the sacrificial layer is additionally provided, and the right graph indicates a D0 fail bit distribution (ZrO₂/TIN) before the sacrificial layer is additionally provided.

Referring to FIG. 15, about 100 to 10000 D0 fail bits are generated in the D0 fail bit distribution (ZrO₂/TIN) before the sacrificial layer is additionally provided, while not more than 1000 D0 fail bits are generated in the D0 fail bit distribution (ZrO₂/PL/TIN) after the sacrificial layer is additionally provided.

That is to say, it can be actually confirmed that the reliability of the semiconductor device 1 to 4 according to the example embodiments of the present inventive concept is much higher than that of the conventional semiconductor device.

Figure 16:
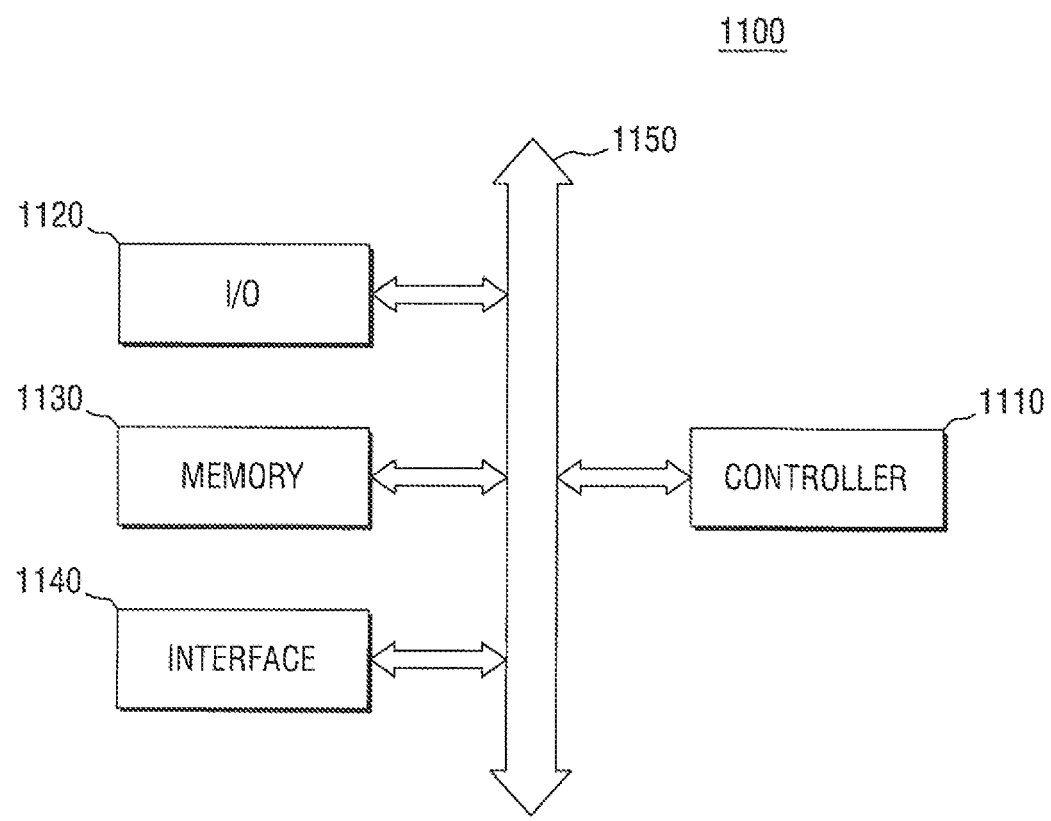
FIG. 16 is a block diagram of an exemplary electronic system including semiconductor devices according to example embodiments of the present inventive concept.

FIG. 16 is a block diagram of an exemplary electronic system including semiconductor devices according to example embodiments of the present inventive concept.

Referring to FIG. 16, the electronic system 1100 may include a controller 1110, an input/output device (I/O) 1120, a memory device 1130, an interface unit 1140 and a bus 1150. The controller 1110, the I/O 1120, the memory device 1130, and/or the interface unit 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or commands. The memory device 1130 may include semiconductor devices according to some embodiments of the present inventive concept. The memory device 1130 may include, for example, a DRAM. The interface unit 1140 may perform functions of transmitting data to a communication network or receiving data from the communication network. The interface unit 1140 may be wired or wireless. For example, the interface unit 1140 may include an antenna or a wired/wireless transceiver, and so on.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 17:
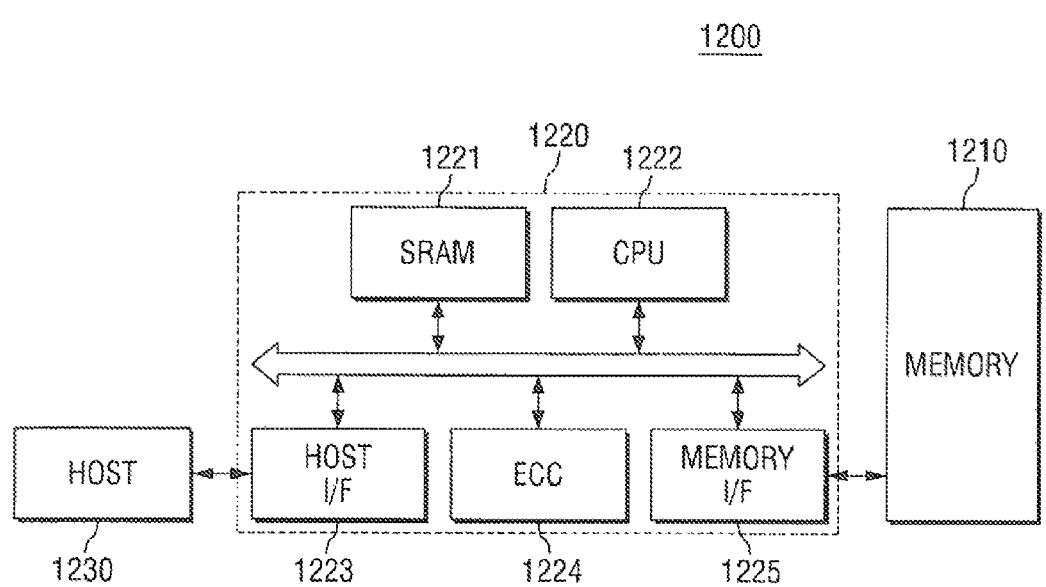
FIG. 17 is a block diagram illustrating an exemplary memory card including semiconductor devices according to example embodiments of the present inventive concept.

FIG. 17 is a block diagram illustrating an exemplary memory card including semiconductor devices according to some embodiments of the present inventive concept.

Referring to FIG. 17, a memory 1210 fabricated according to various embodiments of the present inventive concept may be employed to a memory card 1200. The memory card 1200 includes a memory controller 1220 controlling data exchange between a host 1230 and the memory 1210. A static random access memory (SRAM) 1221 is used as a working memory of a central processing unit 1222. A host interface 1223 includes a data exchange protocol of the host 1230 connected to the memory card 1200. An error correction block 1224 detects and corrects an error included in data read from the memory 1210. A memory interface 1225 interfaces with the memory 1210 according to the present inventive concept. The central processing unit 1222 performs an overall controlling operation for data exchange of the memory controller 1220.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
   a substrate comprising a trench and a gate electrode filling a portion of the trench;
   a lower metal layer;
   a dielectric layer on the lower metal layer opposite the substrate and containing a first metal;
   a sacrificial layer on and in direct contact with the dielectric layer and containing oxygen and a second metal, wherein an electronegativity of the second metal in the sacrificial layer is greater than an electronegativity of the first metal in the dielectric layer, and wherein the sacrificial layer is insulated from the lower metal layer by the dielectric layer; and
   an upper metal layer on the sacrificial layer.

2. The semiconductor device of claim 1, wherein the upper metal layer contains a third metal and the electronegativity of the second metal is greater than an electronegativity of the third metal.

3. The semiconductor device of claim 1, wherein the second metal is molybdenum (Mo) or ruthenium (Ru).

4. The semiconductor device of claim 1, wherein the sacrificial layer includes a first sacrificial layer containing the second metal, and a second sacrificial layer not including the second metal, wherein the first sacrificial layer is between the second sacrificial layer and the dielectric layer.

5. The semiconductor device of claim 4, wherein the first sacrificial layer comprises aluminum oxide.

6. The semiconductor device of claim 4, wherein the first sacrificial layer has a smaller thickness than the second sacrificial layer.

7. The semiconductor device of claim 2 wherein the upper metal layer includes a nitride of the third metal.

8. The semiconductor device of claim 7, wherein the third metal includes at least one of titanium (Ti), zirconium (Zr), aluminum (Al), hafnium (Hf), tantalum (Ta), niobium (Nb), yttrium (Y), lanthanum (La), vanadium (V), manganese (Mn) and tungsten (W).

9. The semiconductor device of claim 1, wherein the upper metal layer includes a noble metal.

10. The semiconductor device of claim 9, wherein the noble metal includes at least one of ruthenium (Ru), platinum (Pt) and iridium (Ir).

11. The semiconductor device of claim 1, wherein the thickness of the sacrificial layer is in a range of 5 Å to 10 Å.

12. The semiconductor device of claim 1, wherein the sacrificial layer is a conductive layer.

13. A semiconductor device comprising:
a transistor including first and second impurity regions;
a bit line electrically connected to the first impurity region;
a lower metal layer electrically connected to the second impurity region;
a dielectric layer on the lower metal layer and containing a first metal;
a sacrificial layer on the dielectric layer opposite the lower metal layer and containing a second metal and oxygen, wherein electronegativity of the second metal is greater than that of the first metal and wherein the sacrificial layer is insulated from the lower metal layer by the dialectic layer; and
an upper metal layer formed on and in direct contact with the sacrificial layer, wherein the sacrificial layer is between the dielectric layer and the upper metal layer.

14. The semiconductor device of claim 13, wherein the lower metal layer has a shape of a cylinder or a pillar.

15. The semiconductor device of claim 13, wherein the sacrificial layer comprises a first sacrificial layer containing molybdenum (Mo) or ruthenium (Ru), and a second sacrificial layer between the first sacrificial layer and the dielectric layer and containing the aluminum (Al).

16. A semiconductor device comprising:
a substrate;
a lower metal layer;
a dielectric layer on the lower metal layer opposite the substrate and containing a first metal;
a diffusion harrier on and in direct contact with the dielectric layer and containing ruthenium (Ru) or molybdenum (Mo) and oxygen, and wherein the diffusion barrier layer is insulated from the lower metal layer by the dielectric layer; and
an upper metal layer on and in direct contact with the diffusion harrier;
wherein the diffusion barrier is configured to obstruct diffusion of oxygen atoms from the dielectric layer into the upper metal layer and to supply oxygen atoms to the upper metal layer.

17. The semiconductor device of claim 16, wherein the diffusion barrier is further configured to for an energy barrier that opposes the diffusion of oxygen atoms from the dielectric layer into the upper metal layer.

18. The semiconductor device of claim 16, wherein the first metal is different from ruthenium (Ru) or molybdenum (Mo) and has a lower electronegativity than ruthenium (Ru) or molybdenum (Mo).

19. The semiconductor device of claim 18, wherein the diffusion barrier comprises a first sacrificial layer including ruthenium (Ru) or molybdenum (Mo), and a second sacrificial layer between the first sacrificial layer and the dielectric layer and not including ruthenium (Ru) or molybdenum (Mo).

20. The semiconductor device of claim 18, wherein the upper metal layer comprises metal nitride,
wherein the metal of the metal nitride includes at least one of titanium (Ti), zirconium (Zr), aluminum (Al), hafnium (Hf), tantalum (Ta), niobium (Nb), yttrium (Y), lanthanum (La), vanadium (V), manganese (Mn) and tungsten (W).

* * * * *